United States Patent [19]

Venkatesh

[11] Patent Number: 4,622,476
[45] Date of Patent: Nov. 11, 1986

[54] TEMPERATURE COMPENSATED ACTIVE RESISTOR

[75] Inventor: Bhimachar Venkatesh, Sunnyvale, Calif.

[73] Assignee: Advanced Micro Devices, Inc., Sunnyvale, Calif.

[21] Appl. No.: 717,363

[22] Filed: Mar. 29, 1985

[51] Int. Cl.[4] ...................... H03H 17/687; H03K 3/26
[52] U.S. Cl. .................................... 307/310; 307/571; 307/580; 307/296 R
[58] Field of Search ........................ 307/310, 570–580, 307/296 R, 303

[56] References Cited
U.S. PATENT DOCUMENTS 3,703,650  11/1972  Kendall ................................ 307/310
4,287,439  9/1981  Leushner ............................. 307/310
4,449,067  5/1984  Nishikawa ........................... 307/580

Primary Examiner—Stanley D. Miller
Assistant Examiner—B. P. Davis
Attorney, Agent, or Firm—Patrick T. King; Eugene H. Valet; Davis Chin

[57] ABSTRACT

A temperature compensated active resistor for use on an integrated circuit semiconductor chip is formed of a N-channel MOS transistor, a string of first, second and third transistors connected as a series of diodes, and a P-channel MOS transistor. The P-channel MOS transistor has its drain electrode connected to an output terminal in which a resistance value at the output terminal remains substantially constant over a relatively wide temperature range.

10 Claims, 3 Drawing Figures

TEMPERATURE COMPENSATED ACTIVE RESISTOR

BACKGROUND OF THE INVENTION

The present invention relates generally to solid-state integrated circuits, and more particularly, it relates to a temperature compensated active resistor for use on an integrated circuit semiconductor chip or substrate wherein a stable voltage is generated which when applied to the gate of a P-channel MOS transistor results in the dynamic channel resistance of the P-channel transistor remaining substantially constant with temperature variations.

As is generally known to those skilled in the art, passive resistors such as poly resistors, N-well resistors and the like are extremely sensitive to temperature variations. Further, when a passive resistor having a high resistance value is manufactured on a semiconductor chip or substrate, a relatively large amount of chip area is required. In order to reduce the amount of chip area needed, there has been formed in the prior art active resistors such as transistors, pinched N-well resistors and the like which utilize a smaller chip area. However, disadvantage of being quite sensitive to temperature fluctuations.

Therefore, it would be desirable to provide a temperature compensated active resistor which not only conserves on the amount of chip area, but has a resistance value that is substantially constant over the temperature range of −55° C. to +135° C.

SUMMARY OF THE INVENTION

Accordingly, it is a general object of the present invention to provide a temperature compensated active resistor which not only conserves on the amount of chip area, but has a resistance value that is substantially constant over a relatively wide temperature range.

It is an object of the present invention to provide a temperature compensated active resistor for use on an integrated semiconductor chip which has a resistance value that remains substantially constant with temperature variations.

It is another object of the present invention to provide a temperature compensated active resistor in which a stable gate voltage is generated for a P-channel MOS transistor.

It is another object of the present invention to provide a temperature compensated active resistor which includes a P-channel MOS transistor whose channel resistance value remains substantially constant with temperature variations.

It is still another object of the present invention to provide a temperature compensated active resistor which includes a stable voltage generator and a P-channel MOS transistor.

It is yet still another object of the present invention to provide a temperature compensated active resistor which is formed of the N-channel MOS transistor, a string of bipolar transistors connected as diodes, and a P-channel MOS transistor.

In accordance with these aims and objectives, the present invention is concerned with the provision of a temperature compensated active resistor having a resistance value which remains substantially constant with temperature variations which includes a N-channel MOS transistor having its drain and gate electrodes connected to a supply potential. The active resistor includes a string of first, second and third bipolar transistors connected as a series of diodes in which all of the collectors of the transistors are connected together and to a ground potential. The source electrode of the N-channel transistor is connected to the emitter of the first bipolar transistor. The base of the first bipolar transistor is connected to the emitter of the second bipolar transistor. The base of the second bipolar transistor is connected to the emitter of the third bipolar transistor. The base of the third bipolar transistor is connected to the ground potential. The active resistor further includes a P-channel MOS transistor having its source electrode connected to the supply potential, its gate electrode connected to the source electrode of the N-channel transistor and its drain electrode connected to an output terminal. The resistance value at the output terminal remains substantially constant over a relatively wide temperature range.

In a second embodiment, two additional N-channel MOS transistors are provided to pass a finite bias current through the PN junctions (emitter-base) of the second and third bipolar trasistors.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
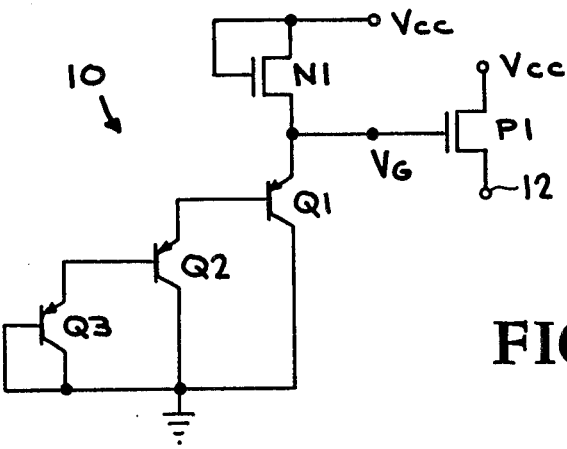
FIG. 1 is a schematic circuit diagram of a temperature compensated active resistor, according to the present invention.

Referring now in detail to the various views of the drawings, there is shown in FIG. 1 a schematic circuit diagram of a temperature compensated active resistor 10 of the present invention. The active resistor 10 is suited to be manufactured in monolithic integrated circuit form. The resistor 10 includes a N-channel MOS transistor N1, a string of PNP-type bipolar transistors Q1–Q3, and a P-channel MOS transistor P1. The drain electrode of the transistor N1 is connected to its gate electrode and to a supply voltage or potential VCC. The source electrode of the transistor N1 is connected to the bipolar transistor Q1. It should be noted that each of the bipolar transistors Q1, Q2 and Q3 are connected as a series of diodes since all of their collectors have been connected together and to a ground potential. Thus, the source electrode of the transistor N1 is connected to the emitter of the bipolar transistor Q1. The base of the bipolar transistor Q1 is connected to the emitter of the bipolar transistor Q2. The base of the bipolar transistor Q2 is connected to the emitter of the bipolar transistor Q3. Finally, the base of the bipolar transistor Q3 is connected to the ground potential. Since the string of transistors Q1–Q3 is functioning as series-connected diodes, the emitters and bases of the respective transistors correspond to the respective anodes and cathodes of the diodes for forming PN junctions.

The transistor N1 serves to limit the current through the PN junction diodes. The source electrode of the transistor N1 is further connected to the gate electrode of the P-channel MOS transistor P1. This nodal junction has been designated as gate voltage $V_G$. The source electrode of the transistor P1 is connected to the supply potential VCC. The drain electrode of the transistor P1 is connected to an output terminal 12.

The N-channel transistor N1 and the string of transistors Q1–Q3 connected as a series of diodes define a stable reference voltage generator. The gate voltage $V_G$ is a very stable voltage which remains substantially constant for a given temperature and is independent of variations in the supply potential. The negative temperature coefficients of the base-to-emitter voltages of the bipolar transistor Q1–Q3 will be offset by the positive temperature coefficient, of the P-channel MOS transistor P1, thereby resulting in a substantially constant channel resistance of the transistor P1. A computer simulation of FIG. 1 resulted in the gate voltages $V_G$ shown in Table I below for the temperatures of $-55°$ C., $+30°$ C. and $+135°$ C. as a function of variations in the supply voltage of $+5$ volts $\pm 10$ percent.

TABLE I

| VCC | | Temperature | | |
|---|---|---|---|---|
| | | $-55°$ C. | $+30°$ C. | $+135°$ C. |
| 4.5 V | $V_G$: | 2.04 V | 1.43 V | 0.72 V |
| 5.0 V | | 2.04 V | 1.43 V | 0.72 V |
| 5.5 V | | 2.10 V | 1.48 V | 0.76 V |

Since the voltage $V_G$ is decreasing with temperature (shown in Table I), when applied to the gate of the P-channel MOS transistor P1, this results in the channel resistance value at the output terminal remaining substantially constant with temperature variations. The resistance values obtained from the simulation of the circuit of FIG. 1 are shown in Table II below for the temperatures of $-55°$ C., $+30°$ C. and $+135°$ C. when a supply potential of $+4.5$ volts was used.

TABLE II

| | Temperature | | |
|---|---|---|---|
| | $-55°$ C. | $+30°$ C. | $+135°$ C. |
| Resistance Value: | 119.1k | 123.5k | 128.2k |

As can be seen, the resistance value at the output terminal 12 is changed only approximately 7.6 percent over the temperature range of $-55°$ C. to $+135°$ C.

Figure 2:
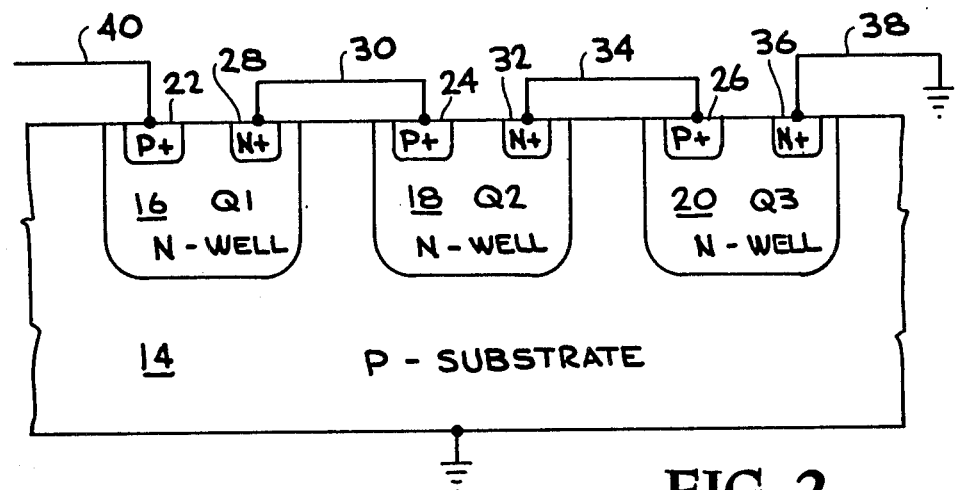
FIG. 2 is a sectional view of a semiconductor substrate for forming the string of transistors of the temperature compensated resistor of FIG. 1.

FIG. 2 is a side elevational in cross-section (not to scale) view of an integrated circuit substrate showing a layout of the string of transistors Q1–Q3 of FIG. 1 which are connected as a series of diodes. A P-type substrate region 14 is used to form the collectors of the transistors Q1, Q2 and Q3 which are joined to a ground connection. A N-well region 16 is formed in the substrate region 14 for forming the base of the transistor Q1. Similarly, a N-well region 18 is formed in the substrate region 14 for forming the base of the transistor Q2. A N-well region 20 is formed in the substrate region 14 for forming the base of the transistor Q3. A P-type region 22 is formed in the N-well region 16 which serves as the emitter of the transistor Q1. A P-type region 24 is formed in the N-well region 18 which serves as the emitter of the transistor Q2. A P-type region 26 is formed in the N-well region 20 which serves as the emitter of the transistor Q3.

A N-type region 28 is also formed in the N-well region 16 and is connected via lead connection 30 to the P-type region 24. Similarly, N-type region 32 is formed in the N-well region 18 and is connected via lead connection 34 to the P-type region 26. A N-type region 36 is formed in the N-well region 20 and is connected to ground via lead connection 38. The P-type region 22 is adapted for connection to the source electrode of the transistor N1 and the gate electrode of the transistor P1 via a lead connection 40. The P-type region 22 and the N-type region 16 serves as a PN junction for the first diode Q1. Similarly, the P-type region 24 and the N-type region 18 serve as a PN junction for the second diode Q2. The P-type region 26 and the N-type region 20 serve as a PN junction of the third diode Q3.

Figure 3:
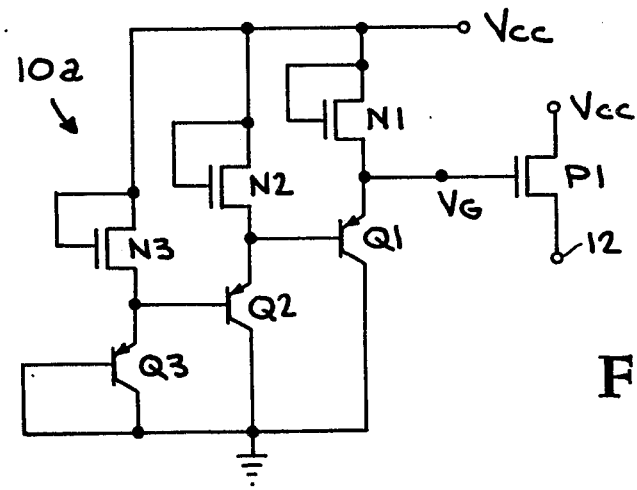
FIG. 3 is a schematic circuit diagram of a second embodiment of a temperature compensated active resistor constructed in accordance with the principles of the present invention.

In FIG. 3, there is shown a schematic circuit diagram of a second embodiment of a temperature compensated active resistor 10a. The construction of the circuit in FIG. 3 is identical to that of FIG. 1, except for the addition of two N-channel MOS transistors N2 and N3. As can be seen, the gate and drain electrodes of the transistor N2 are connected together and to the supply potential VCC. The source electrode of the transistor N2 is connected to the base of the bipolar transistor Q1 and to the emitter of the bipolar transistor Q2. Similarly, the gate and drain electrodes of the transistor N3 are connected together and to the supply potential VCC. The source electrode of the transistor N3 is connected to the base of the bipolar transistor Q2 and to the emitter of the bipolar transistor Q3. The two transistors N1 and N2 serve to generate a finite bias current through the PN junctions of the bipolar transistor Q2 and Q3. Except for these differences, the operation and function of the circuit in FIG. 3 is identical to that explained with respect to FIG. 1 and thus will not be repeated.

The circuits of the present invention are fabricated using a N-well CMOS process which lends itself conveniently to such a transistor configuration as shown in FIGS. 1 and 3. It should be apparent to those skilled in the art that similar circuits may be constructed using a P-well or twin-tub (having both a N-well and a P-well) CMOS process.

From the foregoing detailed description, it can thus be seen that the present invention provides a temperature compensated active resistor for use on an integrated circuit semiconductor chip which includes a N-channel MOS transistor, a string of bipolar transistors connected as a series of diodes, and a P-channel MOS transistor. The channel resistance value of the P-channel MOS transistor remains substantially constant over a relatively wide temperature range.

While there has been illustrated and described what is at present to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best mode contemplated for carrying out this invention, but that the invention will include all embodiments falling within the scope of the appended claims.

What is claimed is:

1. A temperature compensated active resistor having a resistance value which remains substantially constant with temperature variations comprising:
   a N-channel MOS transistor having its drain and gate electrodes connected to a supply potential;
   a string of first, second and third bipolar transistors connected as a series of diodes in which all of the collectors of said bipolar transistors are connected together and to a ground potential;
   said N-channel MOS transistor having its source electrode connected to the emitter of said first bipolar transistor, the base of said first bipolar transistor being connected to the emitter of said second bipolar transistor, the base of said second bipolar transistor being connected to the emitter of said third bipolar transistor, the base of said third bipolar transistor being connected to the ground potential; and
   a P-channel MOS transistor having its source electrode connected to the supply potential, its gate electrode connected to the source electrode of said N-channel MOS transistor and its drain electrode connected to an output terminal, whereby the resistance value at the output terminal remains substantially constant over a relatively wide temperature range.

2. A temperature compensated active resistor as claimed in claim 1, wherein said first, second and third bipolar transistor are of the PNP-type.

3. A temperature compensated active resistor as claimed in claim 1, wherein the temperature range is between a −55° C. to +135° C.

4. A temperature compensated active resistor as claimed in claim 1, wherein the gate electrode of said P-channel MOS transistor is provided with a stable voltage which is independent of variations in the supply potential.

5. A temperature compensated active resistor as claimed in claim 4, wherein the supply potential variations are in the range of +4.5 volts to +5.5 volts.

6. A temperature compensated active resistor having a resistance value which remains substantially constant with temperature variations comprising:
   a first N-channel MOS transistor having its drain and gate electrodes connected to a supply potential;
   a second N-channel MOS transistor having its drain and gate electrodes connected to the supply potential;
   a third N-channel MOS transistor having its drain and gate electrodes connected to the supply potential;
   a string of first, second and third bipolar transistors connected as a series of diodes in which all of the collectors of said bipolar transistors are connected together and to a ground potential;
   the base of said first bipolar transistor being connected to the emitter of said second bipolar transistor, the base of said second bipolar transistor being connected to the emitter of said third bipolar transistor, and the base of said third bipolar transistor being connected to the ground potential;
   said first N-channel transistor having its source electrode connected to the emitter of said first bipolar transistor, said second N-channel transistor having its source electrode connected to the emitter of said second bipolar transistor, and said third N-channel transistor having its source electrode connected to the emitter of said third bipolar transistor; and
   a P-channel MOS transistor having its source electrode connected to the supply potential, its gate electrode connected to the source electrode of said first N-channel MOS transistor and its drain electrode connected to an output terminal, whereby the resistance value at the output terminal remains substantially constant over a relatively wide temperature range.

7. A temperature compensated active resistor as claimed in claim 6, wherein said first, second and third bipolar transistors are of the PNP-type.

8. A temperature compensated active resistor as claimed in claim 6, wherein the temperature range is between a −55° C. to +135° C.

9. A temperature compensated active resistor as claimed in claim 6, wherein the gate electrode of said P-channel MOS transistor is provided with a stable voltage which is independent of variations in the supply potential.

10. A temperature compensated active resistor as claimed in claim 9, wherein the supply potential variations are in the range of +4.5 volts to +5.5 volts.

* * * * *